(12) United States Patent
Chiba et al.

(10) Patent No.: US 10,309,549 B2
(45) Date of Patent: Jun. 4, 2019

(54) VALVE DEVICE, FLUID CONTROL APPARATUS, AND SEMICONDUCTOR MANUFACTURING APPARATUS

(71) Applicant: Fujikin Incorporated, Osaka-shi (JP)

(72) Inventors: Taiji Chiba, Osaka (JP); Izuru Shikata, Osaka (JP)

(73) Assignee: Fujikin Incorporated, Osaka (JP)

( * ) Notice: Subject to any disclaimer, the term of this patent is extended or adjusted under 35 U.S.C. 154(b) by 609 days.

(21) Appl. No.: 14/924,166

(22) Filed: Oct. 27, 2015

(65) Prior Publication Data

US 2016/0123491 A1     May 5, 2016

(30) Foreign Application Priority Data

Oct. 31, 2014    (JP) ................. 2014-222439

(51) Int. Cl.
| | |
|---|---|
| F16K 31/00 | (2006.01) |
| F16K 31/122 | (2006.01) |
| F16K 7/17 | (2006.01) |
| F16K 27/02 | (2006.01) |
| H01L 21/67 | (2006.01) |

(52) U.S. Cl.
CPC .......... *F16K 31/1221* (2013.01); *F16K 7/17* (2013.01); *F16K 27/0236* (2013.01); *F16K 31/1226* (2013.01); *H01L 21/67017* (2013.01)

(58) Field of Classification Search
CPC .......... F16K 31/1221; F16K 27/0236; F16K 31/1226; F16K 7/17
USPC ...................................................... 251/63.5
See application file for complete search history.

(56) References Cited

U.S. PATENT DOCUMENTS

| | | | | |
|---|---|---|---|---|
| 3,633,605 A | * | 1/1972 | Smith .................... | F15B 13/02 137/113 |
| 4,840,347 A | * | 6/1989 | Ariizumi ............ | F16K 31/1221 251/63.4 |
| 4,845,819 A | * | 7/1989 | Kyomen ................ | B29C 65/58 264/242 |
| 5,111,858 A | * | 5/1992 | Aittama ................ | B60K 15/04 141/312 |

(Continued)

FOREIGN PATENT DOCUMENTS

| | | |
|---|---|---|
| JP | 2004197881 | 7/2004 |
| JP | 2010084854 A | 4/2010 |

(Continued)

OTHER PUBLICATIONS

"Korean Application No. 10-2015-0133537, Notification of Reason for Refusal dated Feb. 14, 2017", (Feb. 14, 2017), 11 pgs.

(Continued)

*Primary Examiner* — Umashankar Venkatesan
(74) *Attorney, Agent, or Firm* — Schwegman Lundberg & Woessner, P.A.

(57) ABSTRACT

A valve device has a valve main body and a tube fitting that has an air passage for supplying operation air into the valve main body. An upper lid portion of a cap is formed with a fitted hole provided with a projection. The tube fitting has a fitting portion to be fitted into the upper lid portion. The fitting portion is formed with, on an outer circumference thereof, a fitting groove to which the projection is fitted, and has a tip end portion located closer to a tip end side than the fitting groove.

6 Claims, 4 Drawing Sheets

(56) References Cited

U.S. PATENT DOCUMENTS

| | | | | |
|---|---|---|---|---|
| 5,215,286 | A * | 6/1993 | Kolenc | F16K 7/12 |
| | | | | 251/214 |
| 9,115,813 | B2 * | 8/2015 | Hirose | F16K 7/14 |
| 9,273,794 | B2 * | 3/2016 | Gregoire | F16K 31/1221 |
| 9,518,673 | B2 * | 12/2016 | Tanikawa | F16K 31/1225 |
| 9,638,345 | B2 * | 5/2017 | Okita | F16K 7/14 |
| 9,920,857 | B2 * | 3/2018 | Tanikawa | F16K 31/1221 |
| 2004/0011404 | A1 | 1/2004 | Ku et al. | |
| 2013/0001453 | A1 | 1/2013 | Hirose et al. | |
| 2013/0181148 | A1 * | 7/2013 | Tokuda | F16K 31/1225 |
| | | | | 251/63.6 |
| 2014/0001391 | A1 | 1/2014 | Watanabe et al. | |
| 2018/0023726 | A1 * | 1/2018 | Hirai | F16K 31/365 |

FOREIGN PATENT DOCUMENTS

| | | |
|---|---|---|
| JP | 2011127647 A | 6/2011 |
| JP | 2011154433 A | 8/2011 |
| JP | 2012026544 A | 2/2012 |
| JP | 2014-009765 | 1/2014 |
| KR | 10-2013-0031386 | 3/2013 |
| KR | 1020130031386 | 3/2013 |

OTHER PUBLICATIONS

"Japanese Application No. 2014-222439, Notification of Reasons for Refusal dated Aug. 2, 2018", (Aug. 2, 2018), 9 pgs.

\* cited by examiner

VALVE DEVICE, FLUID CONTROL APPARATUS, AND SEMICONDUCTOR MANUFACTURING APPARATUS

CROSS REFERENCE TO RELATED APPLICATION

This application claims priority from Japanese Patent Application No. 2014-222439 filed Oct. 31, 2014. The entire content of this priority application is incorporated herein by reference.

BACKGROUND OF THE INVENTION

1. Field of the Invention

The present invention relates to a valve device for use in a fluid conduit of a semiconductor manufacturing apparatus and the like, a fluid control apparatus with the valve device, and a semiconductor manufacturing apparatus with the fluid control apparatus.

2. Description of the Related Art

There has conventionally been proposed a pneumatically-actuated diaphragm valve device in which a bonnet and a cap accommodating a stem and a piston are connected to a body having a fluid passage and in which the cap is provided with a female screw portion for mounting a tube fitting onto the cap, the stem and the piston being driven by operation air (see Japanese Patent Application Laid-open No. 2014-9765, for example). The tube fitting has a screw unit having a metal male screw portion and a fitting mounted on the screw unit, wherein the male screw portion of the screw unit is threaded into the female screw portion of the valve device to be mounted onto the valve device.

SUMMARY OF THE INVENTION

Recently there has been a demand for reduction in size of semiconductor manufacturing apparatuses that use the valve device described above, hence reduction in size of the valve device onto which the tube fitting is mounted. However, the configuration of the conventional tube fitting requires a hexagonal fastening member to thread the tube fitting into the cap, resulting in an increase of the vertical length of the valve device by the fastening member. On the other hand, a valve device that has a small tube fitting with a simple configuration has not been proposed yet.

In view of the foregoing, it is an object of the present invention to provide a valve device with a tube fitting, which has a simple configuration and is reduced in size. Another object of the present invention is to provide a fluid control apparatus having this valve device, and a semiconductor manufacturing apparatus having this fluid control apparatus.

In order to achieve these objects, one aspect of the present invention provides a valve device that has a valve main body and a tube fitting coupled to the valve main body and having an air passage for supplying operation air into the valve main body. The valve main body has a body in which a fluid passage is formed, a valve for opening/closing the fluid passage, a stem capable of approaching and separating from the valve to cause the valve to open/close the fluid passage, and an actuator that has a casing and a driving unit. The casing is connected to the body and has a fitted portion to which the tube fitting is fitted. The driving unit is provided inside the casing to drive the stem by means of operation air supplied from the outside via the tube fitting. The fitted portion is formed with a fitted hole and has a projection provided on an inner circumferential surface defining the fitted hole and protruding toward an inner side of the fitted hole. The tube fitting has a fitting portion to be fitted to the fitted portion. The fitting portion is formed with, on an outer circumference thereof, a fitting groove to which the projection is fitted, and has a tip end portion located closer to a tip end of the fitting portion than the fitting groove.

A fluid control apparatus according to one aspect of the present invention has the foregoing valve device.

A semiconductor manufacturing apparatus according to one aspect of the present invention has the foregoing fluid control apparatus as gas supply unit.

DESCRIPTION OF THE EMBODIMENT

A valve device according to an embodiment of the present invention is now described with reference to the drawings.

Figure 1:
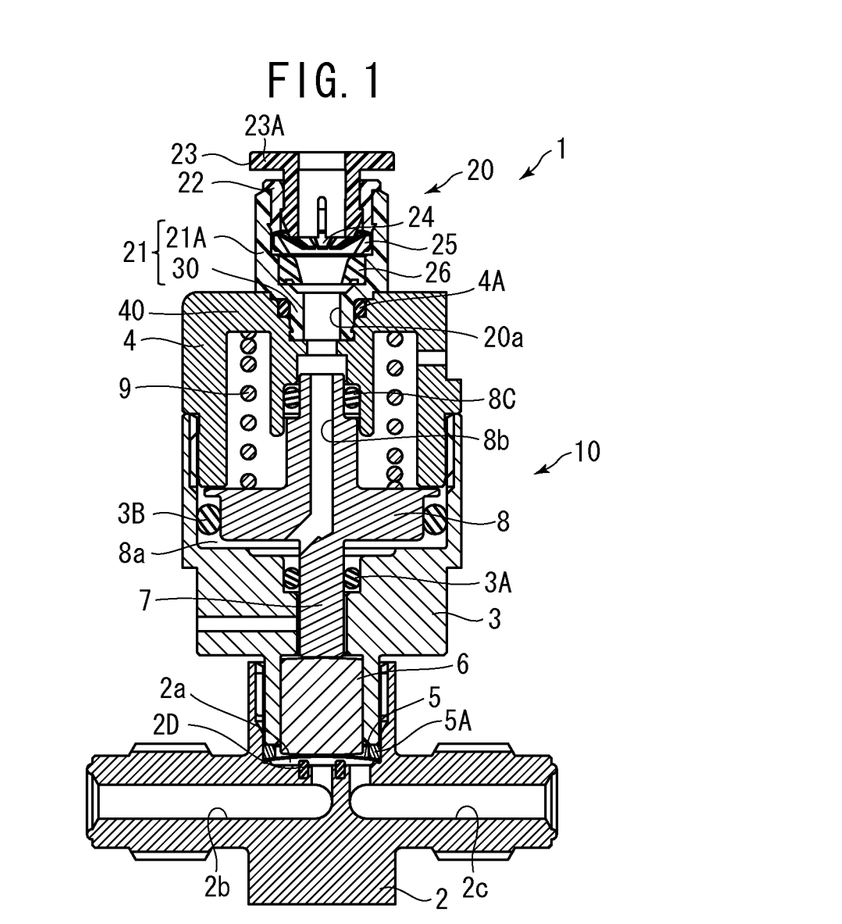
FIG. 1 is a vertical cross-sectional diagram showing a valve device, which is in open state, according to a first embodiment of the present invention.

FIG. 1 is a vertical cross-sectional diagram showing a valve device 1, which is in open state, according to a first embodiment. It should be noted that the valve device 1 shown in FIG. 1 is a diaphragm valve device. As shown in FIG. 1, the valve device 1 has a valve main body 10 and a tube fitting 20. The valve main body 10 mainly has a body 2, a bonnet 3, a cap 4, a diaphragm 5, pressing member 6, a stem 7, a piston 8, and a compression coil spring 9. Hereinafter, the part of the valve device 1 provided with the tube fitting 20 is described as the upper side of the valve device 1, and the part of the valve device 1 provided with the body 2 is described as the lower side of the valve device 1.

A columnar valve chest 2a, a fluid inflow passage 2b and a fluid outflow passage 2c that are in fluid communication with the valve chest 2a, are formed in the body 2. The rim of the part of the body 2 where the fluid inflow passage 2b and the valve chest 2a are in fluid communication with each other is provided with an annular sheet 2D.

The bonnet 3 is in the shape of substantially a cylinder, in which a male screw portion provided in an outer circumference of a lower end portion of the bonnet 3 is threaded into a female screw portion provided in the body 2, whereby the bonnet 3 is fixed to the valve body 2 to cover the valve chest 2a.

The cap 4 is in a substantially cylinder shape with a lid, in which a male screw portion provided in an outer circumference of a lower end portion of the cap 4 is threaded into a female screw portion provided in an upper end portion of the bonnet 3, whereby the cap 4 is fixed to the bonnet 3. The cap 4 has an upper lid portion 40 at an upper end portion thereof. The upper lid portion 40 corresponds to the fitted portion, into which the tube fitting 20 is fitted. The configuration of the upper lid portion 40 is described hereinafter in detail. The cap 4 and the bonnet 3 define a space in which the piston 8 and the compression coil spring 9 are accommodated. The cap 4 is made of metal (e.g., aluminum alloy, etc.). The bonnet 3 and the cap 4 each correspond to the casing of the actuator.

The diaphragm 5 as a valve has its outer rim portion clamped and held by a holding member 5A disposed at a lower end of the bonnet 3 and a bottom surface forming the valve chest 2a of the body 2. The diaphragm 5 is in a domical shape whose arc portion that is convex upward, is in a free state. The diaphragm 5 comes into abutment with and separates from the sheet 2D, thereby opening/closing the fluid passage. The diaphragm 5 is made of, for example, a nickel alloy sheet which is cut into a circle and shaped into the domical shape with its center bulging upward. Note that the diaphragm 5 may be made of a stainless steel sheet or a laminate of a stainless steel sheet and a nickel-cobalt alloy sheet.

The pressing member 6 is provided above the diaphragm 5 and configured to be able to press the center of the diaphragm 5.

The stem 7 is supported by the bonnet 3 so as to be able to move vertically. The stem 7 is configured to bring the diaphragm 5 into abutment with the sheet 2D and separate the diaphragm 5 therefrom by means of the pressing member 6 by approaching and separating from the diaphragm 5. In the present embodiment, the moving direction of the stem 7 corresponds to the vertical direction.

The piston 8 is configured integrally with the stem 7 and provided above the stem 7. The piston 8 is supported by the bonnet 3 and cap 4 so as to be able to move vertically. A lower surface of the piston 8 and an upper surface of the bonnet 3 define an operation air introducing chamber 8a. Furthermore, an operation air introduction passage 8b that extends from an upper end of the piston 8 to the operation air introducing chamber 8a is formed in the piston 8.

The compression coil spring 9 is disposed between a lower surface of the upper lid portion 40 and an upper surface of the piston 8 and constantly urges the piston 8 downward.

A first O-ring 3A is interposed between the bonnet 3 and the stem 7 to guide the vertical movement of the stem 7 and the piston 8. A second O-ring 3B is interposed between the bonnet 3 and the piston 8 to guide the vertical movement of the stem 7 and the piston 8. The first O-ring 3A and the second O-ring 3B seal the regions other than the part where the operation air introducing chamber 8a is in fluid communication with the operation air introduction passage 8b. A third O-ring 8C is interposed between the upper end of the piston 8 and the cap 4 to guide the vertical movement of the piston 8, and prevents the operation air from flowing into the space where the compression coil spring 9 is disposed. A fourth O-ring 4A is interposed between the upper lid portion 40 and the tube fitting 20 to prevent the operation air from leaking to the outside and prevent external contaminants such as dust from flowing in.

The tube fitting 20 is a push-in fitting that extends linearly and is shaped into substantially a cylinder. The tube fitting 20 has a fitting main body 21, a guide cylinder 22, a releasing cylinder 23, locking claws 24, a stopper 25, and a sealing ring 26.

The fitting main body 21 has a tube attachment portion 21A and a fitting portion 30. The guide cylinder 22 is fitted to an inner circumferential surface of the tube attachment portion 21A to be fixed thereto. The open cylinder 23 is supported on an inner circumferential surface of the guide cylinder 22 in such a manner as to be able to move vertically. A flange portion 23A, a part of the open cylinder 23 that is pressed by a finger, is in the shape of an oval or ellipse. The locking claws 24 are provided at a lower end of the open cylinder 23 and digs into an outer circumferential surface of an inserted air tube to prevent the air tube from falling off. In addition, pushing the open cylinder 23 downward releases the locking claws 24 digging into the outer circumferential surface of the air tube. The stopper 25 is provided under the locking claws 24 to prevent an excessive deformation of the locking claws 24. The sealing ring 26 is provided under the stopper 25 and comes into abutment with the outer circumferential surface of the air tube to prevent leakage of the operation air. Note that the fitting main body 21 is made of resin (e.g., polybutylene terephtalate (PBT), etc.). The tube fitting 20 is formed with an air passage 20a that extends from the open cylinder 23 disposed at the upper end and penetrates the fitting portion 30. In the valve device 1 according to the present embodiment, in a state in which the operation air is not introduced into the operation air introducing chamber 8a through the tube fitting 20, the stem 7 and the piston 8 are brought to the bottom dead center by a urging force of the compression coil spring 9, while the diaphragm 5 is pressed by the pressing member 6, the valve device 1 is in the closed state. In other words, the valve device 1 is closed in its normal state. However, in a state in which the operation air is introduced into the operation air introducing chamber 8a through the tube fitting 20, the stem 7 and the piston 8 move to the top dead center against the urging force of the compression coil spring 9, while the pressing member 6 is moved upward by the elastic force of the diaphragm 5 and the pressure of the fluid, the valve device 1 is in the open state. Note that the piston 8, the operation air introducing chamber 8a, the operation air introduction passage 8b, and the compression coil spring 9 correspond to the driving unit of the actuator that drives the stem 7 by means of the operation air.

Figure 2A:
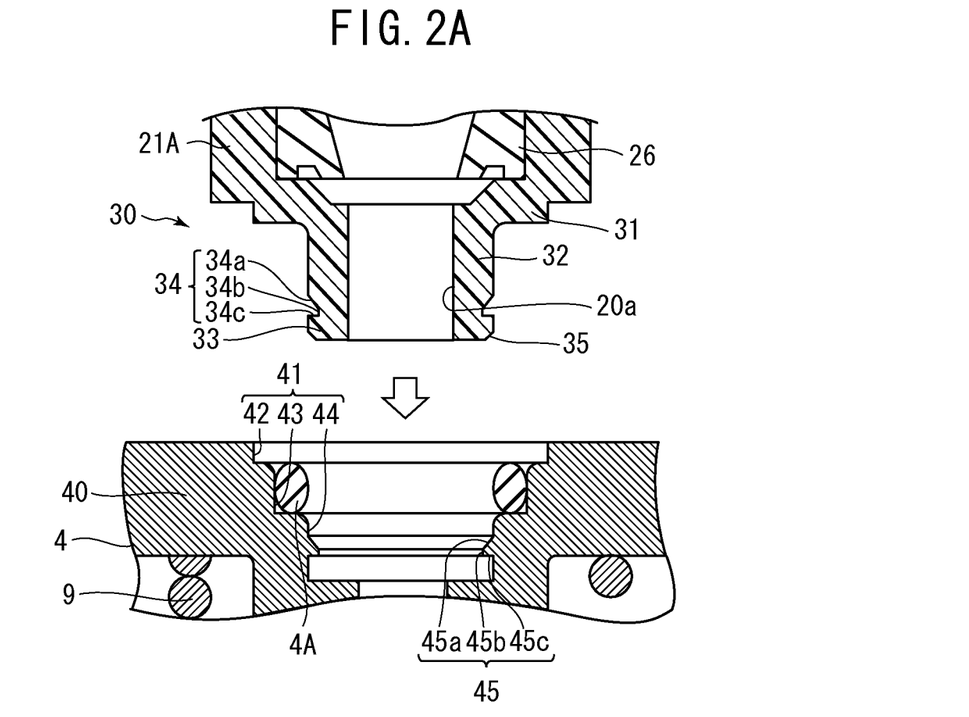
FIG. 2A is a diagram showing a state obtained prior to fitting a fitting portion to an upper lid portion.
Figure 2B:
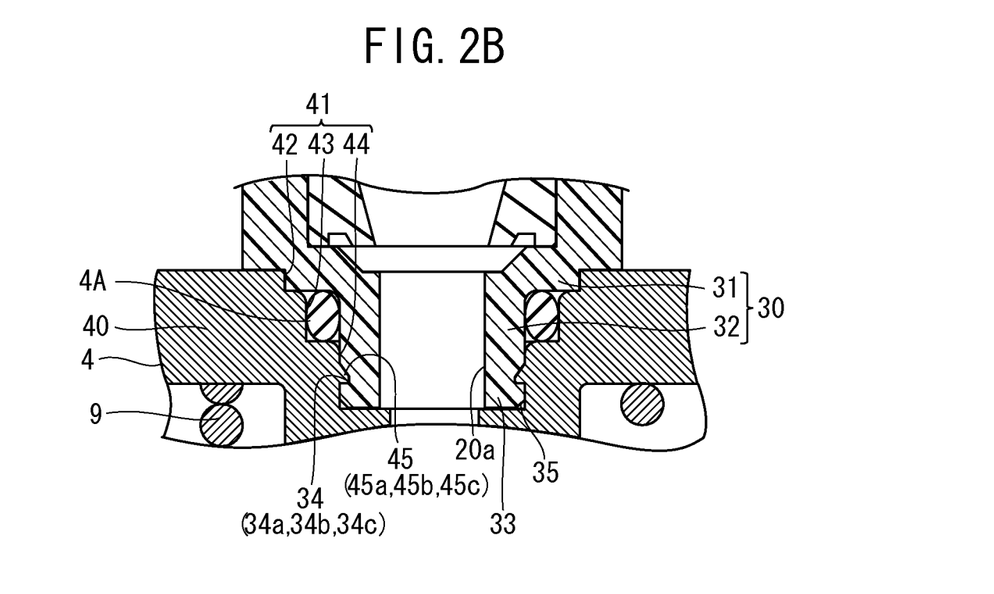
FIG. 2B is a diagram showing a state obtained after the fitting portion is fitted to the upper lid portion.

The configurations of the fitting portion 30 and upper lid portion 40 are described next in detail with reference to FIG. 2. FIG. 2A is a diagram showing a state obtained prior to fitting the fitting portion 30 to the upper lid portion 40. FIG. 2B is a diagram showing a state obtained after the fitting portion 30 is fitted to the upper lid portion 40.

As shown in FIG. 2A, the fitting portion 30 has a first fitting portion 31 and a second fitting portion 32. The first fitting portion 31 is provided under the tube attachment portion 21A and has a diameter shorter than that of the tube attachment portion 21A. The second fitting portion 32 is provided under the first fitting portion 31 and has a diameter shorter than that of the first fitting portion 31. The second fitting portion 32 also has a tip end portion 33 at a lower end thereof. A fitting groove 34 is formed above the tip end portion 33 in such a manner as to form a continuous circle around an outer circumference of the second fitting portion 32.

The fitting groove 34 is configured with a first inclined surface 34a intersecting with the vertical direction and extending downward to the center of the second fitting portion 32, a first vertical surface 34b extending in the vertical direction, and a first sliding surface 34c extending in a direction perpendicular to the vertical direction. An end surface 35 of an outer circumference of the tip end portion 33 tapers toward the tip end.

A fitted hole 41 is formed in the upper lid portion 40. The fitted hole 41 has a first fitted hole 42, a second fitted hole 43, and a third fitted hole 44. The diameter of the first fitted hole 42 is substantially equal to that of the first fitting portion 31. The second fitted hole 43 is formed under the first fitted hole 42 and has a diameter shorter than that of the first fitted hole 42. The third fitted hole 44 is formed under the second fitted hole 43 and has a diameter shorter than that of the second fitted hole 43 and substantially equivalent to that of the second fitting portion 32. The length of the first fitting portion 31 in the vertical direction is substantially equal to that of the first fitted hole 42 in the depth direction, and the length of the second fitting portion 32 in the vertical direction is substantially equivalent to the lengths of the second fitted hole 43 and the third fitted hole 44 in the depth direction.

An inner circumferential surface defining the third fitted hole 44 is provided with an annular projection 45 protruding inward. The projection 45 is configured with a second inclined surface 45a intersecting with the vertical direction and extending downward to the center of the fitted hole 41, a second vertical surface 45b extending in the vertical direction, and a second sliding surface 45c extending in a direction perpendicular to the vertical direction and capable of coming into sliding contact with the first sliding surface 34c.

The upper lid portion 40 is made of aluminum alloy. The fitting portion 30 is made of resin (e.g., PBT, etc.). The radial thickness of the upper lid portion 40 is greater than that of the fitting portion 30. For this reason, the rigidity of the upper lid portion 40 is greater than that of the fitting portion 30.

In order to fit the fitting portion 30 of the tube fitting 20 to the upper lid portion 40 of the cap 4 of the valve main body 10, the fitting portion 30 is inserted into the fitted hole 41, then the end surface 35 of the tip end portion 33 is pressed against the second inclined surface 45a of the projection 45, and the tip end portion 33 is brought past the projection 45 while bending the second fitting portion 32 inward. As a result, the projection 45 of the upper lid portion 40 is fitted into the fitting groove 34 of the fitting portion 30, and consequently the fitting portion 30 of the tube fitting 20 is fitted to the upper lid portion 40 of the valve main body 10. In this manner, the tube fitting 20 is coupled to the valve main body 10 without using a threading member. The O-ring 4A, a sealing member, is interposed between the fitting portion 30 and the upper lid portion 40 and located on the side opposite to the tip end portion 33 with respect to the fitting groove 34 and the projection 45. The fitting portion 30 of the tube fitting 20 is fitted to the upper lid portion 40 of the cap 4 in a rotatable manner, with the first sliding surface 34c and the second sliding surface 45c in sliding contact with each other.

According to the valve device 1 of the present embodiment described above, the fitting portion 30 of the tube fitting 20 is formed with the fitting groove 34, in its outer circumference, to which the projection 45 is fitted, and has the tip end portion 33 located closer to the tip end of the fitting portion 30 than the fitting groove 34. Due to this configuration, the tip end portion 33 of the fitting portion 30 of the tube fitting 20 is brought past the projection 45 of the upper lid portion (the fitted portion) 40, fitting the projection 45 to the fitting groove 34. In this state, the fitting portion 30 is fitted into the fitted hole 41 of the upper lid portion (the fitted portion) 40. Therefore, the tube fitting 20 is coupled to the valve main body 10 without using a threading member. As a result, the vertical length of the valve device 1 with the tube fitting 20 can be reduced because a hexagonal fastening member for fastening the tube fitting 20 to the cap 4 is not necessary. Consequently, the size of the valve device 1 can be reduced, contributing to reduction in size of a flow control apparatus and a semiconductor manufacturing apparatus in which the valve device 1 is used.

The tube fitting 20 is coupled to the valve main body 10 by fitting the projection 45 of the upper lid portion 40 of the cap 4 to the fitting groove 34 of the fitting portion 30 of the tube fitting 20. With such a simple configuration in which the tube fitting 20 and the valve main body 10 are coupled to each other, the number of parts can be reduced, resulting in a reduction in size of the valve device 1, as well as manufacturing costs. Furthermore, not only is it possible to couple the tube fitting 20 and the valve main body 10 to each other easily, but also the tube fitting 20 can be prevented from being easily detached from the valve main body 10.

In addition, the rigidity of the upper lid portion 40 is greater than that of the fitting portion 30. Therefore, the end surface 35 of the tip end portion 33 is pressed against the second inclined surface 45a of the projection 45, and the tip end portion 33 is brought past the projection 45 while bending the second fitting portion 32 inward. As a result, the fitting portion 30 of the tube fitting 20 is fitted into the fitted hole 41 of the upper lid portion (the fitted portion) 40. Consequently, the fitting portion 30 of the tube fitting 20 can easily be coupled to the fitted hole 41 of the upper lid portion 40.

According to the present embodiment, the cap 4 is made of aluminum alloy, and the fitting main body 21 is made of resin. Thus, even when the internal temperature of an apparatus where the valve device 1 is used increases (e.g., 150° C.) to beyond the glass transition temperature of the fitting main body 21 made of resin, causing stress relaxation, and when the fitting portion 30 is spread by the pressure of the operation air, the fitting main body 21 is not detached from the cap 4 because the fitting portion 30 is pressed against the upper lid portion 40 made of aluminum alloy. As a result of the phenomenon in which the fitting portion 30 is spread by the pressure of the operation air, the adhesive force between the fitting portion 30 and the fitted portion 40 increases, preventing leakage of the operation air.

The fitting portion 30 of the tube fitting 20 is fitted into the upper lid portion 40 of the cap 4 in a rotatable manner, with the first sliding surface 34c and the second sliding surface 45c in sliding contact with each other, and the O-ring 4A is interposed between the fitting portion 30 and the upper lid portion 40 and located on the side opposite to the tip end portion 33 with respect to the fitting groove 34 and the projection 45. Therefore, by rotating the tube fitting 20, the oval or elliptical flange portion of the open cylinder 23 can be set in a desired direction in which it can be pushed easily by the operator, so that the operator can easily remove the air tube mounted in the tube fitting 20. The O-ring 4A can prevent not only the entry of external contaminants and the like, but also contaminants and the like from entering between the first sliding surface 34c and the second sliding surface 45c to inhibit smooth rotation of the tube fitting 20.

Figure 3:
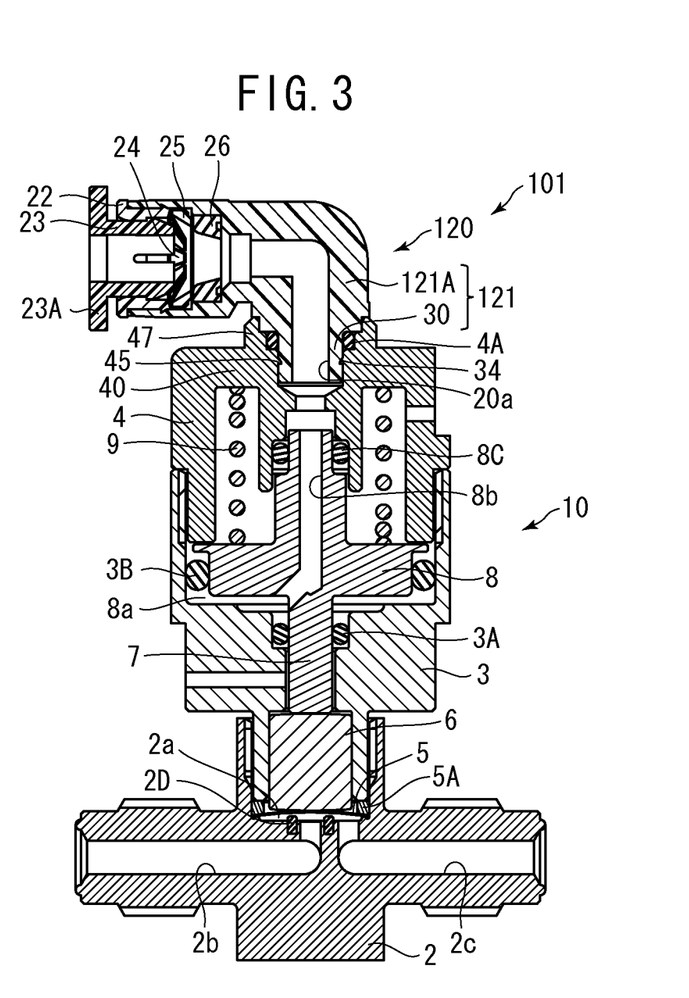
FIG. 3 is a vertical cross-sectional diagram showing a valve device according a second embodiment.

A valve device according to a second embodiment of the present invention is described next with reference to FIG. 3. FIG. 3 is a cross-sectional diagram showing a valve device 101 according to the second embodiment. It should be noted that the same reference numerals are used to describe the members same as those of the valve device 1 of the first embodiment; thus, only the members different from those of the first embodiment are described hereinafter.

The tube fitting 20 of the first embodiment is in a linear shape (the shape of an alphabet "I"), while a tube fitting 120 may be in the shape of an alphabet "L," as shown in FIG. 3. Specifically, a tube mounting portion 121A of a fitting main body 121 is in the shape of an alphabet "L," in which an air tube is inserted into the open cylinder 23 that is mounted in such a manner as to open in the horizontal direction.

The upper lid portion 40 of the cap 4 according to the present embodiment is provided with an annular projection 47. The projection 47 and the upper lid portion 40 each function as the fitted portion, so the fitting portion 30 of the tube fitting 120 is fitted into the projection 47 and the upper lid portion 40. As in the first embodiment, the fitting portion 30 of the tube fitting 120 is fitted into the upper lid portion 40 and projection 47 of the cap 4 in a rotatable manner.

In the valve device 101 according to the second embodiment, because the fitting portion 30 is fitted into the upper lid portion 40 and projection 47 in a rotatable manner, the open cylinder 23 can be set in a desired direction, depending on the position of the air tube, by rotating the tube fitting 120. Such a configuration can contribute to reduction in size of a semiconductor manufacturing apparatus and the like in which the valve device 101 is used.

The valve device 101 of the second embodiment produces substantially the same effects as the valve device 1 of the first embodiment.

A flow control apparatus and a semiconductor control apparatus with the fluid control apparatus, in which the foregoing valve devices 1, 101 are used, are described next.

Figure 4:
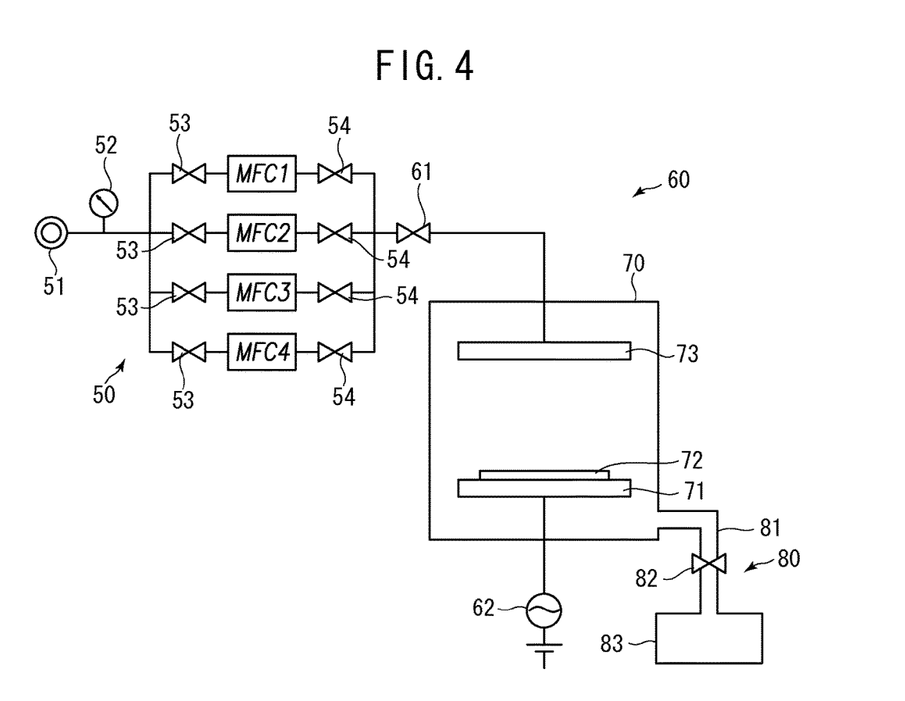
FIG. 4 is a schematic diagram showing a semiconductor control apparatus having gas supply unit.

FIG. 4 is a schematic diagram showing a semiconductor manufacturing apparatus 60 that has gas supply unit 50. The semiconductor manufacturing apparatus 60 is a CVD apparatus, for example, has the gas supply unit 50 functioning as a fluid control apparatus, a vacuum chamber 70, and exhaust unit 80, and creates a passive film (an oxide film) on a wafer.

The gas supply unit 50 has a gas supply source 51, a pressure gauge 52, opening and closing valve devices 53, 54, and MFCs 1 to 4 (massflow controllers). An opening and closing valve device 61 is provided between the gas supply unit 50 and the vacuum chamber 70. The vacuum chamber 70 has a mounting table 71 for placing a wafer 72 and an electrode 73 for forming a thin film on the wafer 72. A commercial power source 62 is connected to the vacuum chamber 70. The exhaust unit 80 has an exhaust pipe 81, an opening and closing valve device 82, and a dust collector 83.

When forming a thin film on the wafer 72, supply of gas to the vacuum chamber 70 is controlled by the opening/closing of the opening and closing valve devices 53, 54, the MFC 1 to 4, and the opening/closing of the opening and closing valve device 61. When removing particulate matter, which is a byproduct generated in forming a thin film on the wafer 72, the opening and closing valve device 82 is opened and the particulate matter is removed by the dust collector 83 through the exhaust pipe 81.

The valve devices 1, 101 according to the present embodiment can be employed to the opening and closing valve devices 53, 54, 61, 82. Reduction in size of the valve devices 1, 101 can accomplish reduction in size of the gas supply unit 50 functioning as the fluid control apparatus. The gas supply unit 50, therefore, is suitable for use in the semiconductor manufacturing apparatus 60 which needs to be reduced in size. Therefore, the size of the semiconductor manufacturing apparatus 60 can be reduced. The use of the miniaturized semiconductor manufacturing apparatus 60 can lead to a reduction in size of its installation area in a clean room and hence a reduction costs of running the clean room (manufacturing costs). Therefore, a semiconductor can be obtained with a more inexpensive manufacturing method.

The above has described an example in which the semiconductor manufacturing apparatus 60 is a CVD apparatus, but the semiconductor manufacturing apparatus 60 may be a sputtering apparatus or an etching apparatus. An etching apparatus (a dry etching apparatus) is configured with a processing chamber, gas supply unit (a fluid control apparatus), and exhaust unit and functions to process the material surfaces and the like by means of a corrosive action of a reactive gas. A sputtering apparatus is configured with a target, a vacuum chamber, gas supply unit (a fluid control apparatus), and exhaust unit and functions to form a film on a material surface. Because such etching apparatus and sputtering apparatus, too, have gas supply unit (fluid control apparatuses) and exhaust unit, the sizes of these apparatuses can be reduced through the use of the valve devices 1, 101.

The present invention is not limited to the foregoing embodiments. Those skilled the art can make various additions, changes and the like within the scope of the present invention.

For instance, the above embodiments has described an aspect of installing the valve device 1, with the tube fitting 20 being positioned on the upper side of the valve device 1 and the body 2 on the lower side of the same, but the direction of installing the valve device 1 is not limited thereto; thus, the valve device 1 may be installed in the horizontal direction or upside-down.

According to the above embodiments, the cap 4 is made of aluminum alloy and the fitting main body 21 is made of resin. However, the materials of these members are not limited thereto; thus, the cap 4 may be made of steel and the fitting main body 21 may be made of aluminum alloy or copper alloy. In other words, the cap 4 and the fitting main body 21 may be made of any materials as long as the rigidity of the upper lid portion 40 of the cap 4 is greater than the rigidity of the fitting portion 30 of the fitting main body 21.

According to the second embodiment, the tube fitting 20 is in the shape of an alphabet "L" and the open cylinder 23 configured to open in a direction perpendicular to the vertical direction (i.e., the horizontal direction). However, the open cylinder 23 may be configured to open in a direction at an angle of, for example, 45 degrees, with respect to the vertical direction, instead of in the direction perpendicular to the vertical direction. In addition, the configuration of the driving unit is not limited to the one described in the above embodiments as long as the driving unit is capable of driving the stem 7 and opening/closing the valve device 1 by means of the diaphragm 5.

The valve devices 1, 101 are diaphragm valve devices but may be other types of valve device as long as they are driven by operation air. Furthermore, each of the valve devices 1, 101 is a valve device that is closed in its normal state, but may be a valve device that is opened in its normal state. The sealing member is an O-ring but may be a ring such as an X-ring, lip packing, or the like.

According to the embodiment described above, the upper lid portion 40 of the cap 4 (the upper lid portion 40 and the projection 47) functions as the fitted portion, and the tube fitting 20 (the tube fitting 120) is fitted into the upper lid portion 40 (the upper lid portion 40 and the projection 47). However, the cylindrical portion (side surface portion) of the bonnet 3 or cap 4 may be caused to function as the fitted portion, and the tube fitting 20 (the tube fitting 120) may be fitted to the cylindrical portion, to supply the operation air to the operation air introducing chamber 8*a*. This configuration can lead to a reduction of the length of the valve device with the tube fitting 20 (the tube fitting 120) in the direction perpendicular to the vertical direction, reducing the size of the valve device.

What is claimed is:
1. A valve device, comprising:
a valve main body; and a tube fitting coupled to the valve main body and having an air introduction passage for supplying operation air into the valve main body, wherein the valve main body has a body in which a fluid passage is formed, a valve for opening/closing the fluid passage, a stem capable of approaching and separating from the valve to cause the valve to open/close the fluid passage, and an actuator that has a casing and a driving unit, the casing being connected to the body and having a fitted portion to which the tube fitting is fitted, the driving unit being provided inside the casing to drive the stem by means of operation air supplied from the outside via the tube fitting, the fitted portion is formed with a fitted hole, and has a projection provided on an inner circumferential surface defining the fitted hole and protruding toward an inner side of the fitted hole, the tube fitting has a fitting portion to be fitted to the fitted portion, the fitting portion is formed with, on an outer circumference thereof, a fitting groove to which the projection is fitted, the fitting portion having a tip end portion that is located closer to a tip end of the fitting portion than the fitting groove, and the projection is located on an innermost side of the fitted hole and has an inclined surface intersecting with a depth direction of the fitted hole and inclining so as to approach a center of the fitted hole in the depth direction as it is deepened, wherein a seal ring is interposed between the fitting portion and the fitted portion, the seal ring located on a side opposite to the tip end portion with respect to the fitting groove and the projection, the fitting portion in contact with the seal ring from one side in an axial direction of the seal ring and from an inner side in a radial direction of the seal ring, and the fitted portion is in contact with the seal ring from the other side in the axial direction and from an outer side in the radial direction.

2. The valve device according to claim 1, wherein the fitted portion of the casing has rigidity greater than that of the fitting portion of the tube fitting.

3. A fluid control apparatus, comprising the valve device according to claim 1 or 2.

4. The fluid control apparatus according to claim 3, which is used in a semiconductor manufacturing apparatus.

5. A semiconductor manufacturing apparatus, comprising the fluid control apparatus of claim 4 as a gas supply unit.

6. The semiconductor manufacturing apparatus according to claim 5, which is a CVD apparatus, a sputtering apparatus, or an etching apparatus.

* * * * *